(12) United States Patent
Sun

(10) Patent No.: US 8,746,308 B2
(45) Date of Patent: Jun. 10, 2014

(54) MANUFACTURING METHOD OF PACKAGE CARRIER

(71) Applicant: Shih-Hao Sun, Hsinchu County (TW)

(72) Inventor: Shih-Hao Sun, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days.

(21) Appl. No.: 13/748,600

(22) Filed: Jan. 24, 2013

(65) Prior Publication Data

US 2013/0137221 A1    May 30, 2013

Related U.S. Application Data

(62) Division of application No. 13/052,122, filed on Mar. 21, 2011, now Pat. No. 8,624,388.

(30) Foreign Application Priority Data

Jan. 19, 2011    (TW) .............................. 100101971 A

(51) Int. Cl.
    *B29C 65/00*    (2006.01)
    *H01L 23/34*    (2006.01)
    *H05K 7/20*    (2006.01)

(52) U.S. Cl.
    USPC ........... 156/359; 257/707; 257/713; 257/720; 361/709; 361/711; 361/712

(58) Field of Classification Search
    USPC ................. 361/401, 388, 414, 709, 711, 712; 174/250–255; 156/359; 257/720, 713
    See application file for complete search history.

(56) References Cited

U.S. PATENT DOCUMENTS

| | | | | |
|---|---|---|---|---|
| 4,554,573 A | * | 11/1985 | Yamamoto et al. | 257/782 |
| 4,993,148 A | * | 2/1991 | Adachi et al. | 29/832 |
| 5,081,562 A | * | 1/1992 | Adachi et al. | 361/764 |
| 5,311,403 A | * | 5/1994 | Tanuma et al. | 361/761 |

(Continued)

FOREIGN PATENT DOCUMENTS

| | | |
|---|---|---|
| CN | 101677116 A | 3/2010 |
| JP | 03-244146 | 10/1991 |

(Continued)

OTHER PUBLICATIONS

"Office Action of Japan Counterpart Application", issued on Feb. 19, 2013, p. 1-p. 4.
"First Office Action of China Counterpart Application", issued on Jan. 13, 2014, p. 1-p. 7.

(Continued)

*Primary Examiner* — Cathy Lam
(74) *Attorney, Agent, or Firm* — Jianq Chyun IP Office

(57) ABSTRACT

In a manufacturing method of a package carrier, a substrate including a first metal layer, a second metal layer having a top surface and a bottom surface opposite to each other, and an insulating layer between the first and second metal layers is provided. The second metal layer has a greater thickness than the first metal layer. A first opening passing through the first metal layer and the insulating layer and exposing a portion of the top surface of the second metal layer is formed. The first metal layer is patterned to form a patterned conductive layer. Second openings are formed on the bottom surface of the second metal layer. The second metal layer is divided into thermal conductive blocks by the second openings that do not connect the first opening. A surface passivation layer is formed on the patterned conductive layer and the exposed portion of the top surface.

8 Claims, 3 Drawing Sheets

(56) References Cited

U.S. PATENT DOCUMENTS

| | | | | |
|---|---|---|---|---|
| 5,450,288 | A * | 9/1995 | Tanuma et al. | 361/761 |
| 5,838,545 | A * | 11/1998 | Clocher et al. | 361/719 |
| 5,875,100 | A * | 2/1999 | Yamashita | 361/764 |
| 5,903,052 | A * | 5/1999 | Chen et al. | 257/706 |
| 6,033,787 | A * | 3/2000 | Nagase et al. | 428/545 |
| 6,294,244 | B1 * | 9/2001 | Iwaida et al. | 428/209 |
| 6,329,713 | B1 * | 12/2001 | Farquhar et al. | 257/712 |
| 7,586,190 | B2 * | 9/2009 | Bogner et al. | 257/717 |
| 8,240,032 | B2 * | 8/2012 | Iihola et al. | 29/834 |
| 2008/0202801 | A1 * | 8/2008 | Tuominen et al. | 174/260 |

FOREIGN PATENT DOCUMENTS

| | | |
|---|---|---|
| JP | 05-251602 | 9/1993 |
| JP | 11-284094 | 10/1999 |
| JP | 2003-332503 | 11/2003 |
| WO | 2010140640 | 12/2010 |

OTHER PUBLICATIONS

"Office Action of Japan Counterpart Application", issued on Mar. 4, 2014, p. 1-p. 3.

* cited by examiner

MANUFACTURING METHOD OF PACKAGE CARRIER

CROSS-REFERENCE TO RELATED APPLICATION

This application is a Divisional of and claims the priority benefit of U.S. patent application Ser. No. 13/052,122, filed on Mar. 21, 2011, now pending, which claims the priority benefit of Taiwan application serial no. 100101971, filed on Jan. 19, 2011. The entirety of each of the above-mentioned patent applications is hereby incorporated by reference herein and made a part of this specification.

BACKGROUND OF THE INVENTION

1. Field of the Invention

The invention relates to a semiconductor structure and a manufacturing method thereof. More particularly, the invention relates to a package carrier and a manufacturing method thereof.

2. Description of Related Art

A chip package provides a chip with proper signal and heat transmission paths and protects the chip structure. A leadframe often serves as a carrier of a chip when a conventional wire bonding technique is applied. As contact density in a chip gradually increases, the leadframe which is unable to further improve the contact density can be replaced by a package substrate which can achieve favorable contact density. Besides, the chip is packaged onto the package substrate by conductive media, such as metal conductive wires or bumps.

In the well-known common light emitting diode (LED) package structure, an LED chip need be packaged before the LED chip is used, and the LED chip generates a significant amount of heat when emitting light. Given the heat cannot be dissipated and continues to accumulate in the LED package structure, the temperature of the LED package structure is increasingly raised. As such, the overly heated LED chip may have luminance decay, shortened life span, or even permanent damages. Therefore, heat sinks are configured in the existing LED package structure, so as to dissipate heat of the LED chip.

The conventional package substrate is comprised of a plurality of patterned conductive layers and at least one insulating layer. The insulating layer is configured between two adjacent patterned conductive layers for electrical insulation. A thermal conductive block is fixed to a lower surface of the package substrate through an adhesive layer. In most cases, the LED chip is electrically connected to the package substrate, and heat generated by the LED chip can be conducted from the patterned conductive layers and the insulating layer to the thermal conductive block. Since the thermal conductivity of the adhesive layer and the insulating layer is unfavorable, thermal resistance increases when the heat generated by the LED chip is conducted from the insulating layer and the adhesive layer to the thermal conductive block, which leads to unsatisfactory heat dissipation. Hence, how to dissipate the heat generated by the LED chip to the external surroundings in an effective manner has become a focus to researchers and designers in this field.

SUMMARY OF THE INVENTION

The invention is directed to a package carrier suitable for carrying a heat-generating element.

The invention is further directed to a manufacturing method of a package carrier. By applying the manufacturing method, the aforesaid package carrier can be formed.

In an embodiment of the invention, a manufacturing method of a package carrier is provided. The manufacturing method includes following steps. A substrate is provided. The substrate includes a first metal layer, a second metal layer, and an insulating layer configured between the first and second metal layers. A thickness of the second metal layer is greater than a thickness of the first metal layer, and the second metal layer has a top surface and a bottom surface opposite to the top surface. A first opening passing through the first metal layer and the insulating layer is formed. The first opening exposes a portion of the top surface of the second metal layer. The first metal layer is patterned to form a patterned conductive layer. A plurality of second openings are formed on the bottom surface of the second metal layer. The second metal layer is divided into a plurality of thermal conductive blocks by the second openings, and the second openings do not communicate with the first opening. A surface passivation layer is formed on the patterned conductive layer and the portion of the top surface of the second metal layer exposed by the first opening.

According to an embodiment of the invention, the step of providing the substrate includes providing the insulating layer and the first and second metal layers that are located at two opposites sides of the insulating layer. A thermal compression process is performed, such that the first metal layer, the insulating layer, and the second metal layer are integrated to form the substrate.

According to an embodiment of the invention, the step of forming the first opening includes stamping, routing, or laser drilling.

According to an embodiment of the invention, the thickness of the second metal layer is 1~100 times the thickness of the first metal layer.

According to an embodiment of the invention, a material of the first metal layer is copper foil.

According to an embodiment of the invention, a material of the second metal layer includes copper, copper alloy, aluminum, or aluminum alloy.

According to an embodiment of the invention, a material of the insulating layer includes resin, liquid crystal polymer (LCP), or polyimide (PI).

According to an embodiment of the invention, the step of forming the second openings includes a photolithography and etching process, a mechanical drilling process, or a laser drilling process.

According to an embodiment of the invention, the step of forming the surface passivation layer includes electroplating.

In an embodiment of the invention, a package carrier suitable for carrying a heat-generating element is provided. The package carrier includes an insulating layer, a patterned conductive layer, a thermal conductive block, and a surface passivation layer. The insulating layer has an upper surface, a lower surface opposite to the upper surface, and a first opening connecting the upper surface and the lower surface. The patterned conductive layer is configured on the upper surface of the insulating layer and exposes the first opening. The thermal conductive block is configured on the lower surface of the insulating layer. Besides, the thermal conductive block has a top surface, a bottom surface opposite to the top surface, and a plurality of second openings. The first opening exposes a portion of the top surface of the thermal conductive block to define a device bonding region, and the second openings do not communicate with the first opening. The surface passivation layer is configured on the patterned conductive layer and the portion of the top surface of the thermal conductive block exposed by the first opening. The heat-generating element is configured on the surface passivation layer correspondingly located above the device bonding region.

According to an embodiment of the invention, a material of the patterned conductive layer is copper foil.

According to an embodiment of the invention, a material of the thermal conductive block includes copper, copper alloy, aluminum, or aluminum alloy.

According to an embodiment of the invention, a material of the insulating layer includes resin, LCP, or PI.

Based on the above, the package carrier described in the embodiments of the invention is formed by two different metal layers with respective thicknesses. Hence, the relatively thick metal layer can act as a thermal conductive block. Besides, the surface of the relatively thick metal layer can be exposed by openings, and the exposed surface can serve as a device bonding region. When a heat-generating element is configured on the package carrier, the heat-generating element is configured on the surface of the thermal conductive block, i.e., configured in the device bonding region. Accordingly, the heat generated by the heat-generating element can be rapidly conducted to external surroundings directly without being blocked by the insulating layer and the adhesive layer. As such, the package carrier described in the embodiments of the invention can effectively dissipate the heat generated by the heat-generating element, and the efficiency and the life span of the heat-generating element can both be improved.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
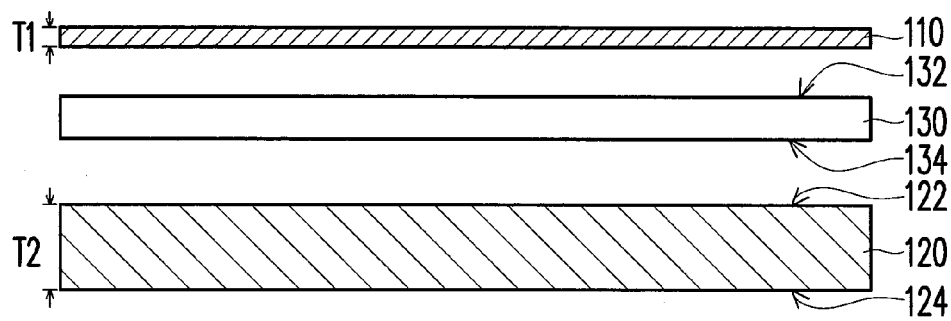
FIG. 1A through FIG. 1E are schematic cross-sectional views illustrating a manufacturing method of a package carrier according to an embodiment of the invention.

FIG. 1A through FIG. 1E are schematic cross-sectional views illustrating a manufacturing method of a package carrier according to an embodiment of the invention. With reference to FIG. 1A, in the manufacturing method of the package carrier of this embodiment, a first metal layer 110, a second metal layer 120, and an insulating layer 130 configured between the first metal layer 110 and the second metal layer 120 are provided. The second metal layer 120 has a top surface 122 and a bottom surface 124 opposite to the top surface 122. The insulating layer 130 has an upper surface 132 and a lower surface 134 opposite to the upper surface 132. Specifically, in this embodiment, the thickness T2 of the second metal layer 120 is greater than the thickness T1 of the first metal layer 110. Preferably, the thickness T2 of the second metal layer 120 is 1~100 times the thickness T1 of the first metal layer 110. Besides, a material of the first metal layer 110 is copper foil, and a material of the second metal layer 120 is copper, copper alloy, aluminum, aluminum alloy, or other metal with good conductivity, for instance. A material of the insulating layer 130 is resin, LCP, or PI, for instance.

Figure 1B:
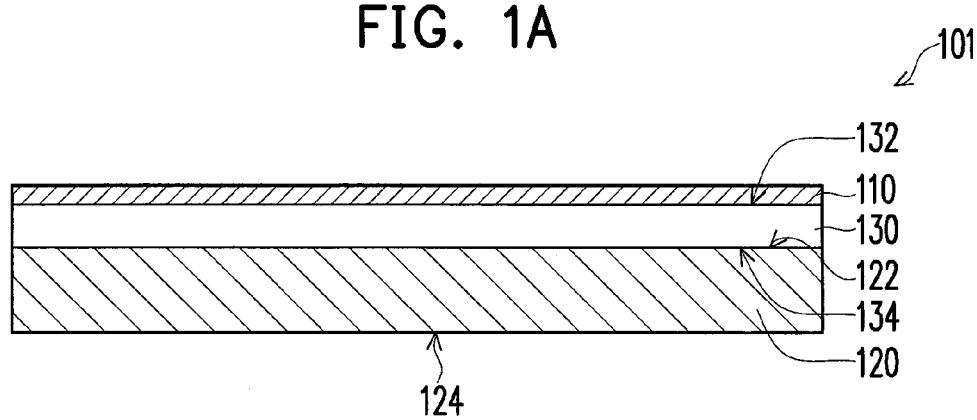

With reference to FIG. 1B, a thermal compression process is performed, such that the first metal layer 110, the insulating layer 130, and the second metal layer 120 are integrated to form the substrate 101. Namely, by performing the thermal compression process, the first metal layer 110 is fixed onto the upper surface 132 of the insulating layer 130, and the second metal layer 120 is fixed onto the lower surface 134 of the insulating layer 130.

Figure 1C:
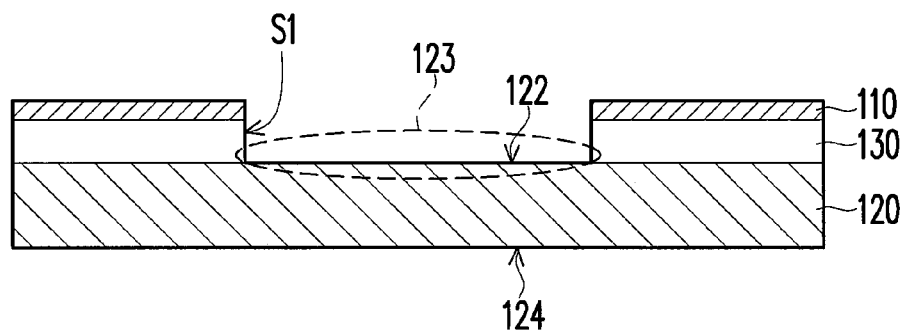

With reference to FIG. 1C, a first opening S1 passing through the first metal layer 110 and the insulating layer 130 is formed. The first opening S1 exposes a portion of the top surface 122 of the second metal layer 120 to define a device bonding region 123. In this embodiment, the first opening S1 is formed by performing a stamping process, a routing process, a laser drilling process, or any other appropriate process, for instance.

Figure 1D:
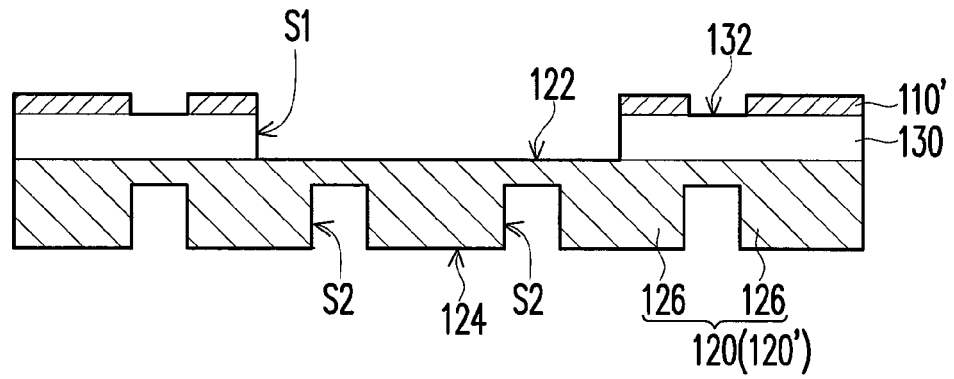

As indicated in FIG. 1D, the first metal layer 110 is patterned to form a patterned conductive layer 110'. The patterned conductive layer 110' exposes a portion of the upper surface 132 of the insulating layer 130.

With reference to FIG. 1D, a plurality of second openings S2 are formed on the bottom surface 124 of the second metal layer 120. The second metal layer 120 is divided into a plurality of thermal conductive blocks 126 by the second openings S2, and the second openings S2 do not communicate with the first opening S1. Namely, the second openings S2 do not communicate with the top surface 122 of the second metal layer. Here, the second metal layer 120 having the second openings S2 can act as thermal conductive blocks 120', and the second openings S2 can serve as a fluid passage. In addition, according to this embodiment, the second openings S2 are formed by performing a photolithography and etching process, a mechanical drilling process, or a laser drilling process, for instance.

It should be mentioned that even though the patterned conductive layer 110' is formed before the second openings S2 are formed in this embodiment, the steps of forming the patterned conductive layer 110' and the second openings S2 are not limited herein. According to another embodiment, the patterned conductive layer 110' can also be formed after the second openings S2 are formed. In still another embodiment, the patterned conductive layer 110' and the second openings S2 can be simultaneously formed if the etching rate is well monitored. In brief, the step of sequentially forming the patterned conductive layer 110' and the second openings S2 is exemplary and should not be construed as a limitation to the invention.

Figure 1E:
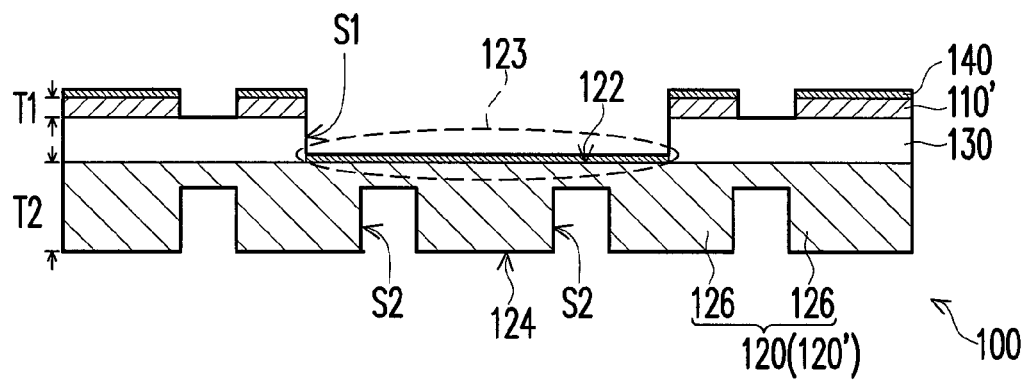

As indicated in FIG. 1E, a surface passivation layer 140 is formed on the patterned conductive layer 110' and the portion of the top surface 122 of the second metal layer 120 exposed by the first opening S1. In other words, the surface passivation layer 140 is located on the patterned conductive layer 110' and in the device bonding region 123. Here, the surface passivation layer 140 serves to protect the patterned conductive layer 110' and the portion of the top surface 122 of the second metal layer 120 exposed by the first opening S1, so as to reduce the oxidation rate. In this embodiment, a material of the surface passivation layer 140 is nickel gold, for instance, and the surface passivation layer 140 is formed by electroplating, for instance. So far, the fabrication of the package carrier 100 is substantially completed.

The package carrier 100 of this embodiment structurally includes the patterned conductive layer 110', the thermal conductive blocks 120', the insulating layer 130, and the surface passivation layer 140. The insulating layer 130 has the upper surface 132, the lower surface 134, and the first opening S1 connecting the upper surface 132 and the lower surface 134. The patterned conductive layer 110' is configured on the upper surface 132 of the insulating layer 130 and exposes the first opening S1. The thermal conductive blocks 120' are configured on the lower surface 134 of the insulating layer 130 and have the top surface 122, the bottom 124, and a plurality of second openings S2. Specifically, the first opening S1 exposes a portion of the top surface 122 of the thermal conductive blocks 120', so as to define the device bonding region 123, and the second openings S2 do not communicate with the first opening S1. The surface passivation layer 140 is configured on the patterned conductive layer 110' and the portion of the top surface 122 of the thermal conductive blocks 120' exposed by the first opening S1. That is to say, the surface passivation layer 140 is configured in the device bonding region 123.

Figure 2:
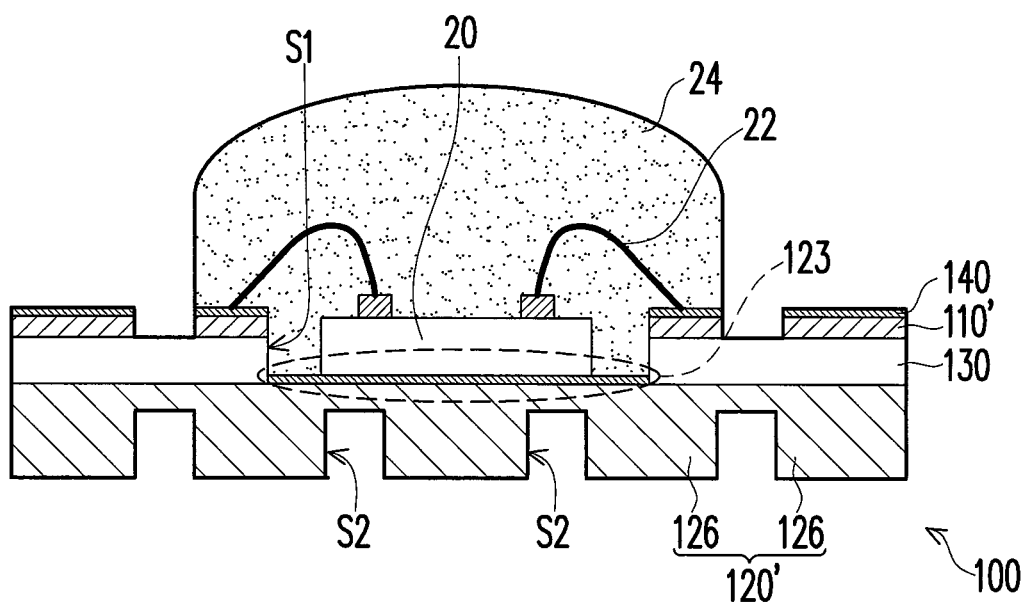
FIG. 2 is a schematic cross-sectional view illustrating that the package carrier depicted in FIG. 1E carries a heat-generating element.

FIG. 2 is a schematic cross-sectional view illustrating that the package carrier depicted in FIG. 1E carries a heat-generating element. With reference to FIG. 2, in this embodiment, the package carrier 100 is suitable for carrying a heat-generating element 20. The heat-generating element 20 is configured on the surface passivation layer 140 correspondingly located above the device bonding region 123. Here, the heat-generating element 20 is an electronic chip or a photoelectric device, for instance, which should not be construed as a limitation to the invention. For instance, the electronic chip can be an integrated circuit chip, e.g., a chip module or an individual chip that includes a graphic chip, a memory chip, a semiconductor chip, and so forth. The photoelectric device is a light emitting diode (LED), a laser diode, or a gas discharge light source, for instance. In this embodiment, the heat-generating element 20 is an LED, for instance.

Specifically, the heat-generating element 20, e.g., a semiconductor chip, can be electrically connected to the surface passivation layer 140 by wire bonding through a plurality of bonding wires 22. Alternatively, the heat-generating element 20, the bonding wires 22, and a portion of the package carrier 100 can be encapsulated by a molding compound 24, so as to secure the electrical connection among the heat-generating element 20, the bonding wires 22, and the package carrier 100. In addition, the heat-generating element 20 can be directly configured on the surface passivation layer 140 correspondingly located above device bonding region 123. Namely, the heat-generating element 20 is configured on the surface passivation layer 140 that is made of a metallic material (e.g., nickel gold) and located above the thermal conductive blocks 120'. Thereby, the heat generated by the heat-generating element 20 can be rapidly conducted to external surroundings through the thermal conductive blocks 120' and the surface passivation layer 140 which is made of the metallic material. Compared with the related art, in this embodiment, it is not necessary to additionally attach the thermal conductive blocks to the bottom of the package carrier through the adhesive layer, and the heat generated by the heat-generating element 20 need not be conducted through the insulating layer and the adhesive layer. As a result, the package carrier 100 not only can effectively dissipate the heat generated by the heat-generating element 20 but also can improve the efficiency and life span of the heat-generating element 20. Moreover, the manufacturing costs can be reduced.

Note that the way to bond the heat-generating element 20 and the package carrier 100 and the type of the heat-generating element 20 are not limited in the invention. Although the heat-generating element 20 described in this embodiment is electrically connected to the surface passivation layer 140 of the package carrier 100 by wire bonding, the heat-generating element 20 in another embodiment can also be electrically connected to the surface passivation layer 140 located above the device bonding region 123 by flip-chip bonding through a plurality of bumps (not shown). In another embodiment of the invention, the heat-generating element 20 can be a chip package (not shown) and is installed to the package carrier 100 by conducting a surface mount technology (SMT). The way to bond the heat-generating element 20 and the package carrier 100 and the type of the heat-generating element 20 are exemplary and should not be construed as limitations to the invention.

In light of the foregoing, the package carrier described in the embodiments of the invention is formed by two different metal layers with respective thicknesses. Hence, the relatively thick metal layer can act as a thermal conductive block. Besides, the surface of the relatively thick metal layer can be exposed by openings, and the exposed surface can serve as a device bonding region. When a heat-generating element is configured on the package carrier, the heat-generating element is configured on the surface of the thermal conductive block, i.e., configured in the device bonding region. Accordingly, the heat generated by the heat-generating element can be rapidly conducted to external surroundings directly without being blocked by the insulating layer and the adhesive layer. As such, the package carrier described in the embodiments of the invention can effectively dissipate the heat generated by the heat-generating element, and the efficiency and the life span of the heat-generating element can both be improved.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:
1. A manufacturing method of a package carrier, comprising:
   providing a substrate, comprising:
      providing a insulating layer and a first and a second metal layers respectively located at two opposite sides of the insulating layer; and
      performing a thermal compression process, such that the first metal layer, the insulating layer, and the second metal layer are integrated to form the substrate, wherein a thickness of the second metal layer is greater than a thickness of the first metal layer, and the second metal layer has a top surface and a bottom surface opposite to the top surface;
   forming a first opening passing through the first metal layer and the insulating layer, the first opening exposing a portion of the top surface of the second metal layer;
   patterning the first metal layer to form a patterned conductive layer;
   forming a plurality of second openings on the bottom surface of the second metal layer, wherein the second metal layer is divided into a plurality of thermal conductive blocks by the second openings, and the second openings do not communicate with the first opening; and
   forming a surface passivation layer entirely covering the patterned conductive layer and the portion of the top surface of the second metal layer exposed by the first opening.

2. The manufacturing method of the package carrier as claimed in claim 1, wherein the step of forming the first opening comprises stamping, routing, or laser drilling.

3. The manufacturing method of the package carrier as claimed in claim 1, wherein the thickness of the second metal layer is 1~100 times the thickness of the first metal layer.

4. The manufacturing method of the package carrier as claimed in claim 1, wherein a material of the first metal layer is copper foil.

5. The manufacturing method of the package carrier as claimed in claim 1, wherein a material of the second metal layer comprises copper, copper alloy, aluminum, or aluminum alloy.

6. The manufacturing method of the package carrier as claimed in claim 1, wherein a material of the insulating layer comprises resin.

7. The manufacturing method of the package carrier as claimed in claim 1, wherein the step of forming the second openings comprises photolithography and etching process, mechanical drilling process, or a laser drilling process.

8. The manufacturing method of the package carrier as claimed in claim 1, wherein the step of forming the surface passivation layer comprises electroplating.

\* \* \* \* \*